(12) United States Patent
Sato

(10) Patent No.: US 10,481,508 B2
(45) Date of Patent: Nov. 19, 2019

(54) EXPOSURE APPARATUS AND METHOD OF MANUFACTURING ARTICLE

(71) Applicant: CANON KABUSHIKI KAISHA, Tokyo (JP)

(72) Inventor: Takanori Sato, Utsunomiya (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 16/243,200

(22) Filed: Jan. 9, 2019

(65) Prior Publication Data

US 2019/0146359 A1 May 16, 2019

Related U.S. Application Data

(63) Continuation of application No. 15/700,481, filed on Sep. 11, 2017, now Pat. No. 10,209,631.

(30) Foreign Application Priority Data

Sep. 15, 2016 (JP) .................................. 2016-180906

(51) Int. Cl.
*G03F 7/20* (2006.01)
*G03F 9/00* (2006.01)
*G01B 11/26* (2006.01)

(52) U.S. Cl.
CPC ...... *G03F 7/70775* (2013.01); *G03F 7/70358* (2013.01); *G03F 7/70641* (2013.01); *G03F 7/70725* (2013.01); *G03F 9/7023* (2013.01); *G03F 9/7026* (2013.01); *G01B 11/26* (2013.01); *G03F 7/7085* (2013.01)

(58) Field of Classification Search
CPC . G01B 11/26; G03F 7/70725; G03F 7/70641; G03F 7/70775; G03F 7/7085; G03F 9/7023; G03F 9/7026
USPC ................................................. 355/53, 72, 77
See application file for complete search history.

(56) References Cited

U.S. PATENT DOCUMENTS 6,813,000 B1  11/2004  Nishi
9,268,240 B2   2/2016  Sato

FOREIGN PATENT DOCUMENTS

JP       2014165284 A       9/2014

OTHER PUBLICATIONS

Office Action issued in U.S. Appl. No. 15/700,481 dated Jun. 14, 2018.
Notice of Allowance issued in U.S. Appl. No. 15/700,481 dated Oct. 22, 2018.

*Primary Examiner* — Colin W Kreutzer
(74) *Attorney, Agent, or Firm* — Rossi, Kimms & McDowell LLP

(57) ABSTRACT

The present invention provides an exposure apparatus which transfers a pattern of a mask onto a substrate by exposing the substrate while scanning the mask and the substrate, the apparatus including a stage configured to hold the substrate and move, a control unit configured to control movement of the stage, a first measurement unit configured to measure a position, in a height direction, of a shot region of the substrate held by the stage before the shot region reaches an exposure area where the shot region is exposed, and a second measurement unit configured to measure the position of the shot region in the height direction prior to the first measurement unit.

11 Claims, 11 Drawing Sheets

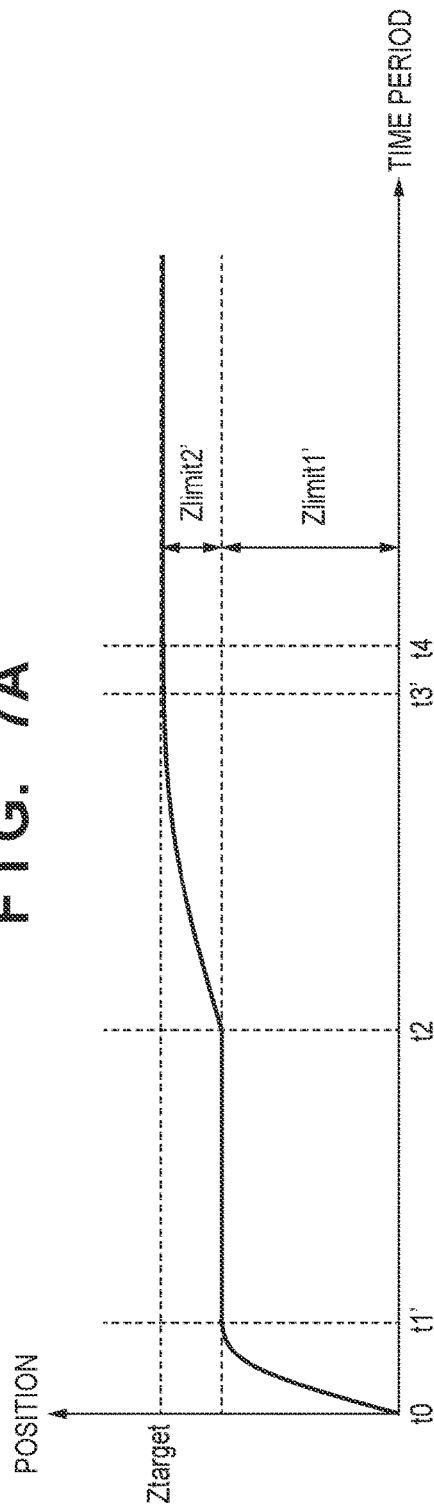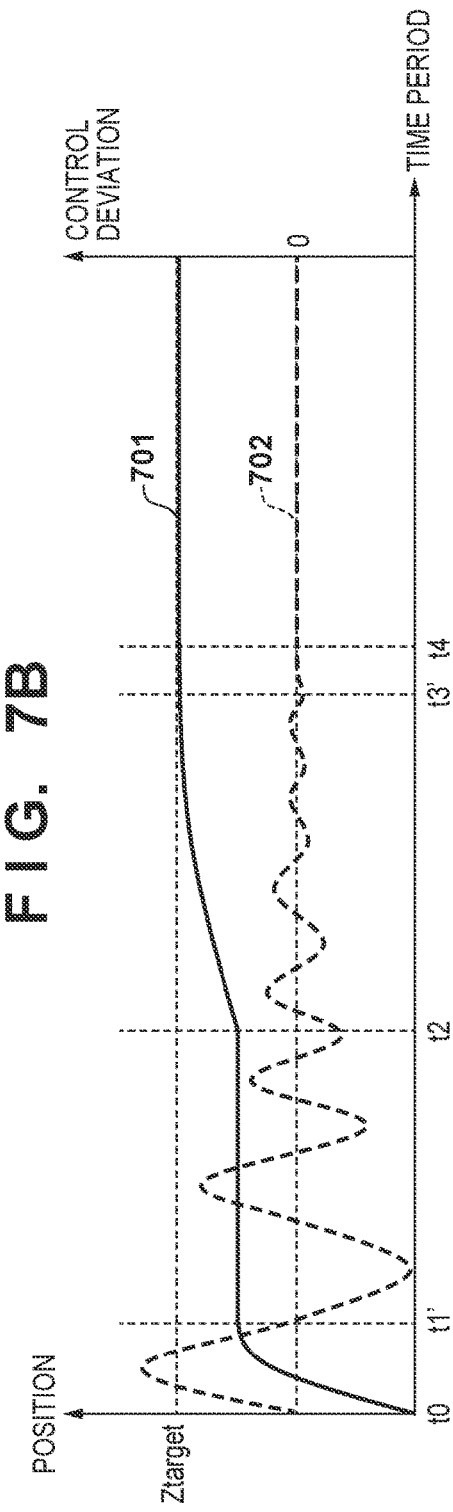

EXPOSURE APPARATUS AND METHOD OF MANUFACTURING ARTICLE

BACKGROUND OF THE INVENTION

Field of the Invention

The present invention relates to an exposure apparatus and a method of manufacturing an article.

Description of the Related Art

When a semiconductor device or the like is manufactured using a photolithography technique, a step-and-scan exposure apparatus (scanner) which transfers the pattern of a mask onto a substrate while scanning the mask and the substrate is used. Japanese Patent Laid-Open No. 2014-165284 proposes that a plurality of measurement units which measure the surface position (height-direction position) of a substrate held by a substrate stage should be provided in such an exposure apparatus. Japanese Patent Laid-Open No. 2014-165284 discloses an exposure apparatus which includes the first measurement unit (read-ahead sensor) measuring a position spaced apart from the projection position of an exposure slit in a scanning direction and the second measurement unit (read-further ahead sensor) measuring a position further spaced apart from the projection position of the exposure slit than that of the first measurement unit.

In scanning exposure, fitting of an exposure object area of the substrate to an optimum exposure position is performed by the first driving in which the substrate stage is driven based on a measurement result of the second measurement unit and the second driving in which the substrate stage is driven based on a measurement result of the first measurement unit. Note that the optimum exposure position is a suitable height-direction position, and is the best focus position of the exposure slit (image plane) and a position within the range of an allowable depth of focus relative to the best focus position.

In order to improve the productivity of the exposure apparatus, it is considered that the scanning speed of the substrate stage in scanning exposure is increased to reduce a time period required for exposure. In this case, a time period between measuring the surface position of the substrate and starting exposure of the substrate is reduced, making it necessary to reduce a time period required for fitting of the exposure object area of the substrate to the optimum exposure position.

On the other hand, in recent years, there is proposed a technique of stacking a memory cell on a substrate in order to implement an increase in capacity and a reduction in bit cost of a NAND flash memory. However, the flatness of the substrate is decreased, or flatness unevenness occurs by stacking the memory cell. Consequently, the driving amount of the substrate stage required for fitting of the exposure object area of the substrate to the optimum exposure position tends to be large.

Therefore, in fitting of the exposure object area of the substrate to the optimum exposure position, the substrate stage needs to be driven in a shorter time period and by a larger driving amount than before. If driving of the substrate stage is thus controlled, however, the substrate stage cannot respond sufficiently, increasing a control deviation. If the control deviation does not converge at time when exposure of the substrate is started (that is, the control deviation does not fall within an allowable range), that causes an exposure error by defocus.

SUMMARY OF THE INVENTION

The present invention provides an exposure apparatus advantageous in controlling driving of a substrate on a substrate stage in a height direction.

According to one aspect of the present invention, there is provided an exposure apparatus which transfers a pattern of a mask onto a substrate by exposing the substrate while scanning the mask and the substrate, the apparatus including a stage configured to hold the substrate and move, a control unit configured to control movement of the stage, a first measurement unit configured to measure a position, in a height direction, of a shot region of the substrate held by the stage before the shot region reaches an exposure area where the shot region is exposed, and a second measurement unit configured to measure the position of the shot region in the height direction prior to the first measurement unit, wherein the control unit controls the stage so as to perform first driving in which the substrate is driven in the height direction based on a measurement result of the second measurement unit and second driving in which the substrate is driven in the height direction based on a measurement result of the first measurement unit after the second measurement unit measures the position of the shot region in the height direction and until the shot region reaches the exposure area, and makes a driving amount of the stage in the height direction in the first driving larger than half a distance corresponding to a difference between a final target position of the shot region in the height direction and the position of the shot region in the height direction measured by the second measurement unit.

Further features of the present invention will become apparent from the following description of exemplary embodiments with reference to the attached drawings.

BRIEF DESCRIPTION OF THE DRAWINGS

FIGS. 7A and 7B are timing charts for explaining control regarding driving of the substrate stage according to an embodiment.

DESCRIPTION OF THE EMBODIMENTS

Figure 1:
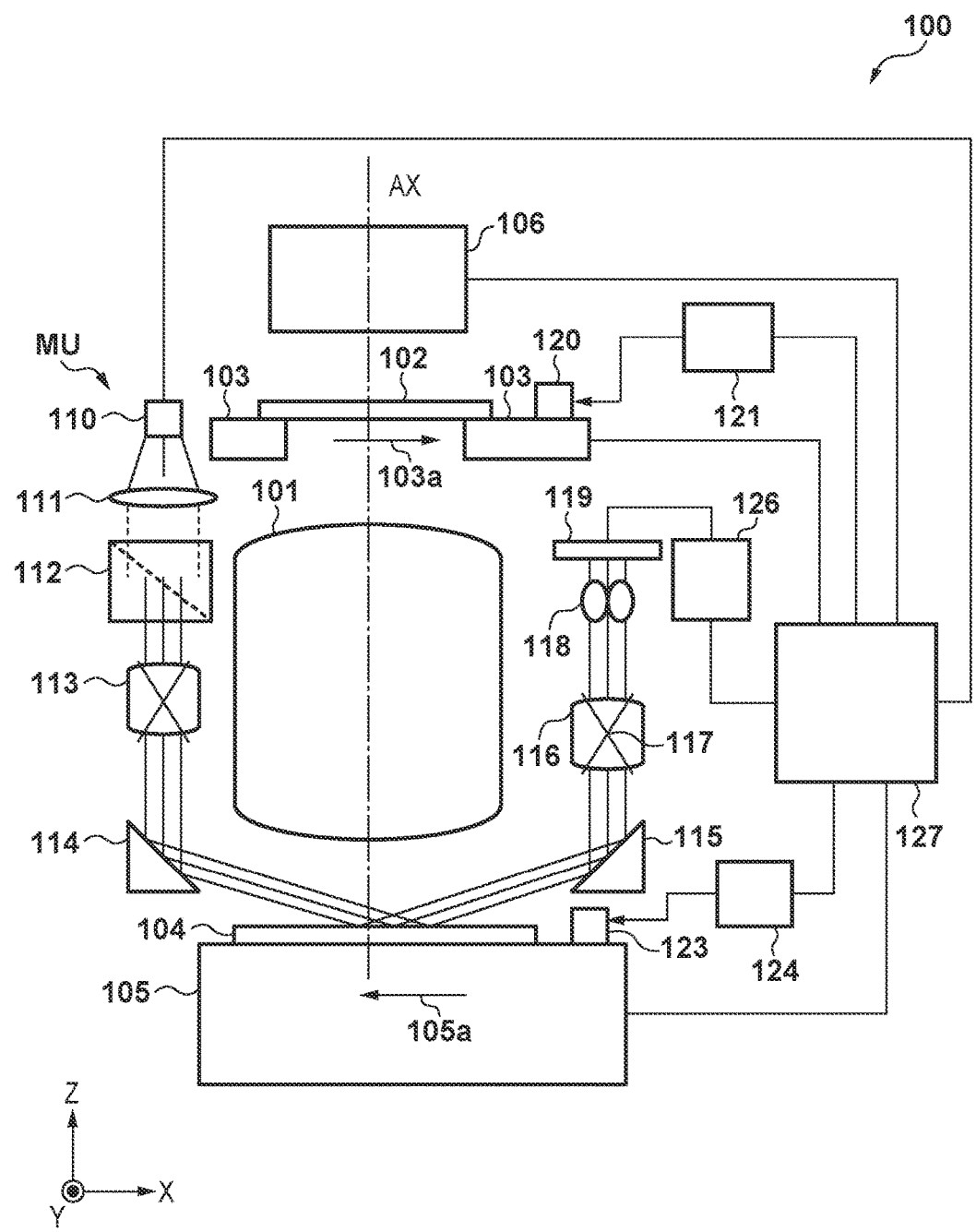
FIG. 1 is a schematic view showing the arrangement of an exposure apparatus according to an aspect of the present invention.

Preferred embodiments of the present invention will be described below with reference to the accompanying drawings. Note that the same reference numerals denote the same members throughout the drawings, and a repetitive description thereof will not be given.

FIG. 1 is a schematic view showing the arrangement of an exposure apparatus 100 according to an aspect of the present invention. The exposure apparatus 100 transfers the pattern of a mask 102 onto a substrate 104 while scanning the mask 102 and the substrate 104. In an embodiment, the exposure apparatus 100 is a step-and-scan exposure apparatus (scanner) which uses an exposure area of a rectangular or arc slit shape and performs exposure at a large angle of view with high accuracy by relatively scanning the mask 102 and the substrate 104 at a high speed. As shown in FIG. 1, the exposure apparatus 100 includes a projection optical system 101, a mask stage 103, a substrate stage 105, an illumination optical system 106, a main control unit 127, and a measurement unit MU.

A Z-axis is defined in a direction parallel to an optical axis AX of the projection optical system 101, and the image plane of the projection optical system 101 is perpendicular to the Z-axis direction. The mask stage 103 holds a mask 102. The pattern of the mask 102 is projected at the magnification (for example, ¼, ½, or ⅕) of the projection optical system 101, forming an image on the image plane of the projection optical system 101.

The substrate 104 is, for example, a wafer whose surface is coated with a resist (photosensitive agent). A plurality of shot regions having the same pattern structure formed by the preceding exposure process are arrayed on the substrate 104. The substrate stage 105 is a stage which holds the substrate 104 and moves, and includes a chuck for chucking (fixing) the substrate 104. The substrate stage 105 also includes an X-Y stage which is horizontally movable in the X- and Y-axis directions, and a Z stage which is movable in the Z-axis direction (the height direction of the substrate 104) parallel to the optical axis AX of the projection optical system 101. The substrate stage 105 also includes a leveling stage rotatable about the X- and Y-axes, and a rotation stage rotatable about the Z-axis. The substrate stage 105 therefore constructs a six-axis driving system for making the pattern image of the mask 102 coincide with the shot region of the substrate 104. Positions of the substrate stage 105 in the X-, Y-, and Z-axis directions are always measured by a bar mirror 123 arranged on the substrate stage 105 and an interferometer 124.

The measurement unit MU has a function of measuring the surface position (height-direction position) and tilt of the substrate 104. In the embodiment, the measurement unit MU measures the height-direction positions of measurement object portions in the shot region of the substrate 104 held by the substrate stage 105. The measurement unit MU includes two light sources 110, two collimator lenses 111, two slit members 112, two light projecting side optical systems 113, two light projecting side mirrors 114, two light receiving side mirrors 115, two light receiving side optical systems 116, two stopper diaphragms 117, two correction optical systems 118, and two photoelectric converters 119. The measurement unit MU includes the first measurement unit and the second measurement unit each including one light source 110, one collimator lens 111, one slit member 112, one light projecting side optical system 113, one light projecting side mirror 114, one light receiving side mirror 115, one light receiving side optical system 116, one stopper diaphragm 117, one correction optical system 118, and one photoelectric converter 119. The first measurement unit and the second measurement unit are different in position in an X-Y plane to measure. The first measurement unit measures a position spaced apart from the projection position of the exposure slit in a scanning direction. The second measurement unit measures a position further spaced apart from the projection position of the exposure slit than that of the first measurement unit. That is, the second measurement unit measures, prior to the first measurement unit, the height of a shot region to be exposed in the Z-axis direction. Based on measurement result of the measurement unit MU, the substrate stage 105 is controlled in the Z-axis direction, as will be described later. In the control, the first measurement unit and the second measurement unit are switched by a switch SW1 to be described later and used.

Each light source 110 includes a lamp, a light emitting diode, or the like. Each collimator lens 111 converts light emitted by a corresponding one of the light sources 110 into parallel light whose section has an almost uniform intensity distribution. Each slit member 112 is constructed by bonding a pair of prisms (prism-shaped members) so that their inclined surfaces face each other. A plurality of openings (15 pinholes in the embodiment) are formed in the bonded surface by using a light shielding film made of chrome or the like. Each light projecting side optical system 113 is a bi-telecentric system, and guides beams having passed through the 15 pinholes of a corresponding one of the slit members 112 to 15 measurement object portions in the shot region on the substrate 104 via a corresponding one of the light projecting side mirrors 114.

A plane (bonded surface) on which the pinholes are formed, and a plane including the surface of the substrate 104 are set to satisfy a shine proof condition with respect to the light projecting side optical systems 113. In the embodiment, an incident angle (angle defined by the optical axis AX) Φ of light from each light projecting side optical system 113 to the substrate 104 is 70° or more. The 15 beams having passed through each light projecting side optical system 113 enter independent measurement object portions on the substrate and form images. Light from each light projecting side optical system 113 enters the substrate from a direction which is rotated by 0° (for example, 22.5°) on the X-Y plane from the X-axis direction so that 15 measurement object portions on the substrate can be observed independently.

Each light receiving side optical system 116 is a bi-telecentric system. The 15 beams (reflected beams) reflected by the respective measurement object portions on the substrate 104 enter the light receiving side optical system 116 via a corresponding one of the light receiving side mirrors 115. Each stopper diaphragm 117 is arranged in a corresponding one of the light receiving side optical systems 116 and is set commonly to the 15 measurement object portions. The stopper diaphragm 117 cuts off high-order diffracted light (noise light) generated by a pattern formed on the substrate 104.

The optical axes of the beams having passed through the light receiving side optical systems 116 are parallel to each other. Each correction optical system 118 includes 15 correction lenses, and forms the 15 beams having passed through the corresponding one of the light receiving side optical systems 116 into spot beams having the same size on the photoelectric conversion surface (light receiving surface) of a corresponding one of the photoelectric converters 119. In the embodiment, the light receiving side optical systems 116, the stopper diaphragms 117, and the correction optical systems 118 perform inclination correction so that the respective measurement object portions on the substrate and the photoelectric conversion surfaces of the photoelectric converters 119 become conjugate to each other. Thus, a change of the position of a pinhole image on each photoelectric conversion surface does not arise from local tilt of each measurement object portion on the substrate. The pinhole image on each photoelectric conversion surface changes in accordance with a change of the height of each measurement object portion in a direction parallel to the optical axis AX. Each photoelectric converter 119 is constructed by, for example, 15 one-dimensional CCD line sensors. However, a plurality of two-dimensional sensors may be arranged instead.

As described above, the mask stage 103 holds the mask 102. The mask stage 103 is scanned at a constant speed in the X-axis direction (direction indicated by an arrow 103a) in a plane perpendicular to the optical axis AX of the projection optical system 101. At this time, the mask stage 103 is scanned so that a position of the mask stage 103 in the Y-axis direction always maintains a target position (correction driving). Positions of the mask stage 103 in the X- and Y-axis directions are always measured by a bar mirror 120 arranged on the mask stage 103 and an interferometer 121.

The illumination optical system 106 illuminates the mask 102 by using light from a light source which generates pulsed light such as an excimer laser. The illumination optical system 106 includes a beam shaping optical system, an optical integrator, a collimator lens, a mirror, a masking blade, and the like. The illumination optical system 106 efficiently transmits or reflects pulsed light in the far-ultraviolet area. The beam shaping optical system forms the sectional shape (dimensions) of incident light into a predetermined shape. The optical integrator uniforms the light distribution characteristic and illuminates the mask 102 at a uniform illuminance. The masking blade defines a rectangular illumination area corresponding to a chip size. The pattern of the mask 102 partially illuminated in this illumination area is projected to the substrate 104 via the projection optical system 101.

The main control unit 127 includes a CPU, memory, and the like and comprehensively controls the respective units of the exposure apparatus 100. The main control unit 127 controls the mask stage 103 which holds the mask 102, and the substrate stage 105 which holds the substrate 104, in order to form light from the pattern of the mask 102 into an image in a predetermined area of the substrate 104. For example, the main control unit 127 adjusts, via the mask stage 103 and substrate stage 105, the positions of the mask 102 and substrate 104 in the X-Y plane (positions in the X- and Y-axis directions and a rotation about the Z-axis), and their positions in the Z-axis direction (rotations about the X- and Y-axes). The main control unit 127 scans the mask stage 103 and substrate stage 105 in synchronism with the projection optical system 101. As described above, the main control unit 127 controls the exposure process of exposing the respective shot regions of the substrate 104 in the exposure area while scanning the substrate 104 by the substrate stage 105.

When the mask stage 103 is scanned in the direction indicated by the arrow 103a, the substrate stage 105 is scanned in a direction indicated by an arrow 105a at a speed corrected by the magnification (reduction magnification) of the projection optical system 101. The scanning speed of the mask stage 103 is determined to be advantageous for the productivity, based on the width of the masking blade in the scanning direction in the illumination optical system 106, and the sensitivity of a resist applied to the surface of the substrate 104.

The pattern of the mask 102 is aligned in the X-Y plane based on positions of the mask stage 103, substrate stage 105, and respective shot regions on the substrate 104 with respect to the substrate stage 105. As described above, the positions of the mask stage 103 and substrate stage 105 are measured by the interferometers 121 and 124, respectively. The positions of the respective shot regions on the substrate 104 with respect to the substrate stage 105 are obtained by detecting, with an alignment microscope (not shown), the position of a mark provided on the substrate stage 105 and the position of an alignment mark formed on the substrate 104.

Alignment of the pattern of the mask 102 in the Z-axis direction, that is, alignment to the image plane of the projection optical system 101 is implemented by controlling (the leveling stage included in) the substrate stage 105 based on the measurement result of the measurement unit MU.

Figure 2:
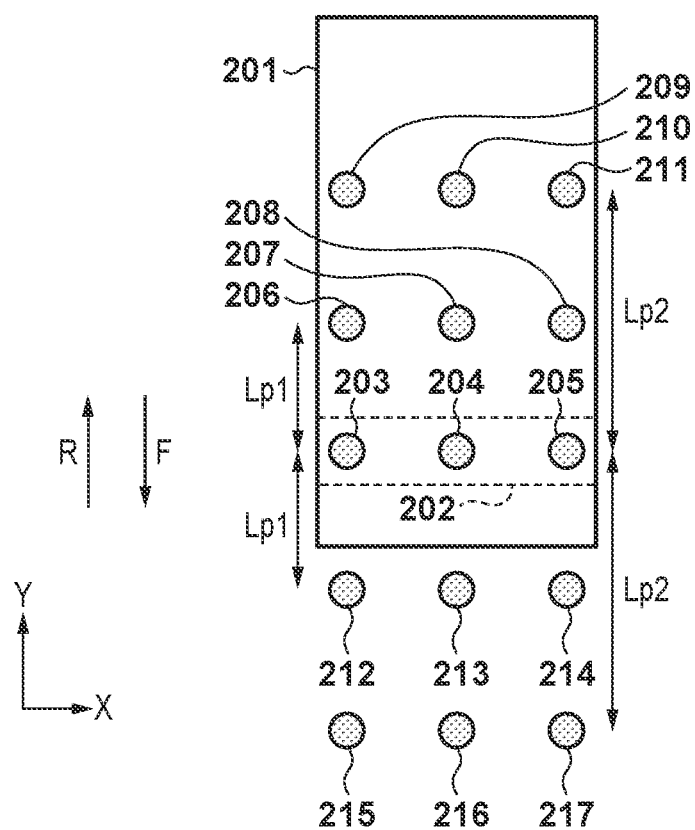
FIG. 2 is a view showing the relationship between an exposure slit and measurement points formed in a shot region of a substrate by measurement unit.

FIG. 2 is a view showing the relationship between an exposure slit 202, and measurement points 203 to 217 formed in a shot region 201 of the substrate 104 by the measurement unit MU. The exposure slit 202 is a rectangular exposure area indicated by a broken line in FIG. 2. In other words, the exposure area is an area in the X-Y plane where the exposure slit 202 is projected. The position of the exposure slit 202 in the X-Y plane is a position facing the final lens of the projection optical system 101. The measurement points 203, 204, and 205 are measurement points formed in the exposure slit 202. The measurement points 206, 207, and 208 and the measurement points 212, 213, and 214 are measurement points formed at positions spaced apart by a distance Lp1 from the exposure slit 202. The measurement points 209, 210, and 211 and the measurement points 215, 216, and 217 are measurement points formed at positions spaced apart by a distance Lp2 from the exposure slit 202. The distances Lp1 and Lp2 have a relationship of Lp1<Lp2.

In the embodiment, the measurement points 206, 207, and 208 and the measurement points 212, 213, and 214 are the measurement points of the first measurement unit of the measurement unit MU. The measurement points 209, 210, and 211 and the measurement points 215, 216, and 217 are the measurement points of the second measurement unit of the measurement unit MU. In the exposure process, the first measurement unit measures the height-direction positions of the measurement object portions in the shot region 201 of the substrate 104 held by the substrate stage 105 before the shot region 201 reaches the exposure slit 202. In the exposure process, the second measurement unit measures, prior to the first measurement unit, the height-direction positions of the measurement object portions in the shot region 201 of the substrate 104.

The main control unit 127 can control the measurement timings of the measurement points 203 to 217 by the measurement unit MU based on the distances between the exposure slit 202 and the respective measurement points 203 to 217, and the scanning direction and scanning speed of the substrate stage 105. The measurement points 203, 206, 209, 212, and 215 are formed at the same X-coordinate position. The measurement points 204, 207, 210, 213, and 216 are formed at the same X-coordinate position. Further, the measurement points 205, 208, 211, 214, and 217 are formed at the same X-coordinate position. For example, when the substrate stage 105 is scanned in the Y-axis direction, the same coordinate position of the shot region 201 can be measured at different measurement points by adjusting the measurement timings of the measurement points 203 to 217.

Figure 3A:
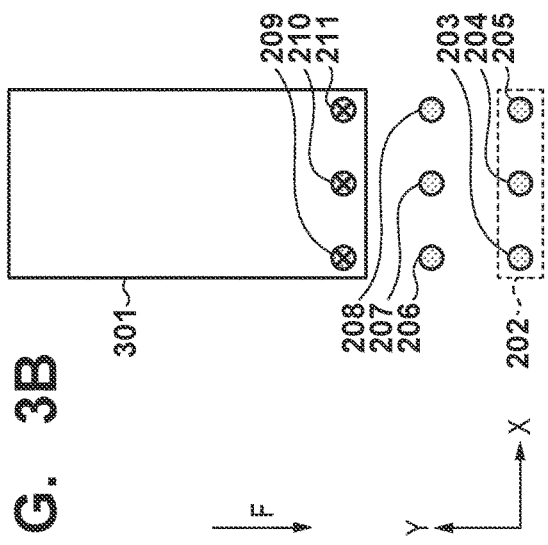
FIGS. 3A to 3D are views for explaining measurement, by the measurement unit, of height-direction positions of measurement object portions in a shot region.
Figure 3B:
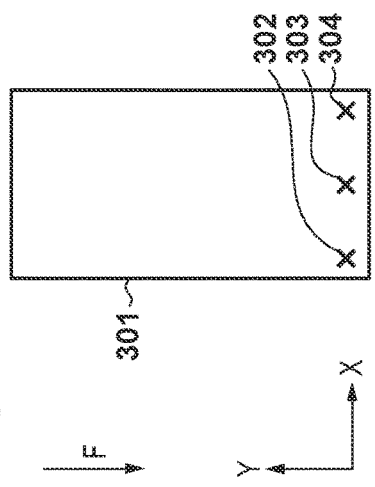
Figure 3C:
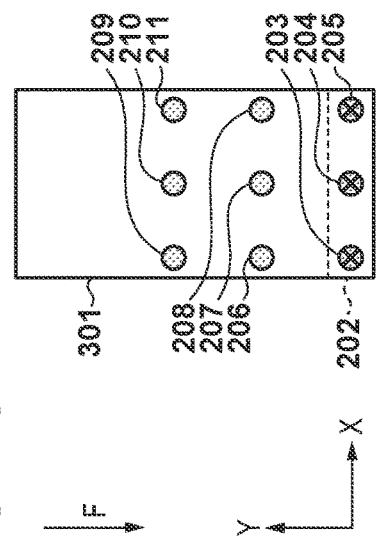
Figure 3D:
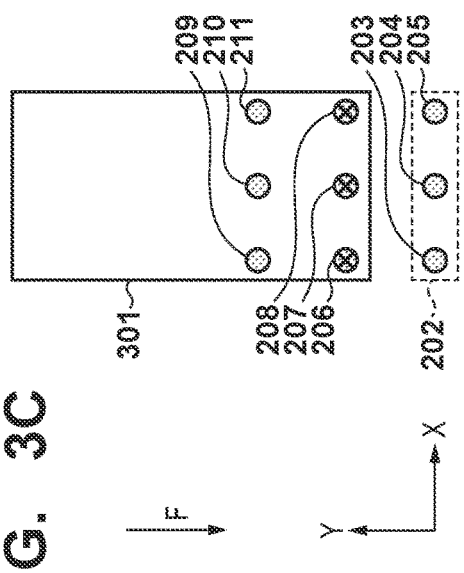

Measurement of the height-direction positions of measurement object portions in a shot region 301 by the measurement unit MU will be described with reference to FIGS. 3A to 3D. In FIG. 3A, measurement object positions 302, 303, and 304 indicate positions to be measured in the shot region 301. There are a plurality of measurement object portions of the shot region 301 in the Y-axis direction in order to measure the height-direction position of the entire shot region 301. However, FIG. 3A shows only the measurement object portions 302, 303, and 304 for simplicity.

For example, a case in which the height-direction position of the measurement object portion 302 in the shot region 301 is measured by scanning the substrate stage 105 in a direction indicated by an arrow F, as shown in FIG. 3A, will be examined. In a state shown in FIG. 3B, the main control unit 127 controls the measurement timing so that the measurement unit MU measures the height-direction position of the measurement object portion 302 at the measurement point 209. In a state shown in FIG. 3C upon the lapse of a predetermined time period, the main control unit 127 controls the measurement timing so that the measurement unit MU measures the height-direction position of the measurement object portion 302 at the measurement point 206. Further, in a state shown in FIG. 3D upon the lapse of a predetermined time period, the main control unit 127 controls the measurement timing so that the measurement unit MU measures the height-direction position of the measurement object portion 302 at the measurement point 203.

Similarly, a case in which the height-direction of the measurement object portion 303 in the shot region 301 is measured by scanning the substrate stage 105 in the direction indicated by the arrow F will be examined. In the state shown in FIG. 3B, the main control unit 127 controls the measurement timing so that the measurement unit MU measures the height-direction position of the measurement object portion 303 at the measurement point 210. In the state shown in FIG. 3C upon the lapse of a predetermined time period, the main control unit 127 controls the measurement timing so that the measurement unit MU measures the height-direction position of the measurement object portion 303 at the measurement point 207. Further, in the state shown in FIG. 3D upon the lapse of a predetermined time period, the main control unit 127 controls the measurement timing so that the measurement unit MU measures the height-direction position of the measurement object portion 303 at the measurement point 204.

Similarly, a case in which the height-direction position of the measurement object portion 304 in the shot region 301 is measured by scanning the substrate stage 105 in the direction indicated by the arrow F will be examined. In the state shown in FIG. 3B, the main control unit 127 controls the measurement timing so that the measurement unit MU measures the height-direction position of the measurement object portion 304 at the measurement point 211. In the state shown in FIG. 3C upon the lapse of a predetermined time period, the main control unit 127 controls the measurement timing so that the measurement unit MU measures the measurement object portion 304 at the measurement point 208. Further, in the state shown in FIG. 3D upon the lapse of a predetermined time period, the main control unit 127 controls the measurement timing so that the measurement unit MU measures the height-direction position of the measurement object portion 304 at the measurement point 205.

In accordance with a direction (moving direction) in which the substrate stage 105 is scanned, the main control unit 127 switches the measurement point to be used to measure the height-direction position of a measurement object portion in the shot region 301. For example, referring to FIG. 2, when the substrate stage 105 is scanned in the direction indicated by the arrow F, the heights of measurement object portions in the shot region 201 are measured at the measurement points 206 to 211. In contrast, when the substrate stage 105 is scanned in a direction indicated by an arrow R, the height-direction positions of measurement object portions in the shot region 201 are measured at the measurement points 212 to 217. Based on these measurement results, the main control unit 127 calculates the height-direction position (position in the Z-axis direction) of an exposure object area including the measurement object portions in the shot region 201. The main control unit 127 moves the substrate stage 105 in the Z-axis direction (height-direction of the substrate 104) so that the exposure object area is positioned at an optimum exposure position (final target position) until the exposure object area reaches the exposure slit 202. Note that the optimum exposure position is the image plane of the pattern of the mask 102, that is, the position (best focus position) of the image plane of the projection optical system 101. However, the optimum exposure position does not mean a position that completely coincides with the position of the image plane of the projection optical system 101 but includes a position within the range of an allowable depth of focus.

Figure 4A:
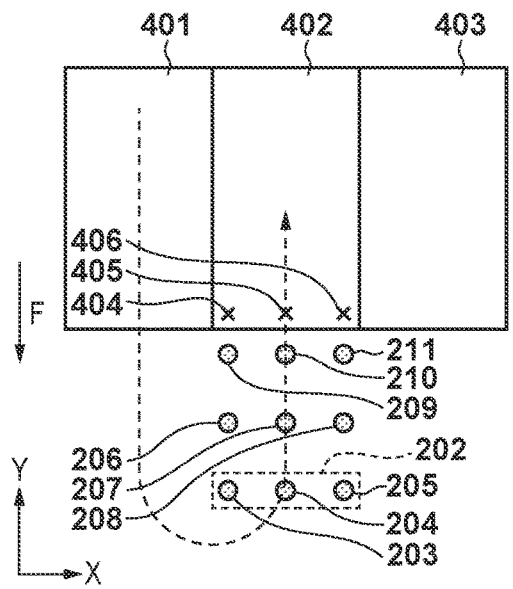
FIGS. 4A to 4C are views for explaining, in detail, measurement of the heights of measurement object portions in shot regions in an exposure process.
Figure 4B:
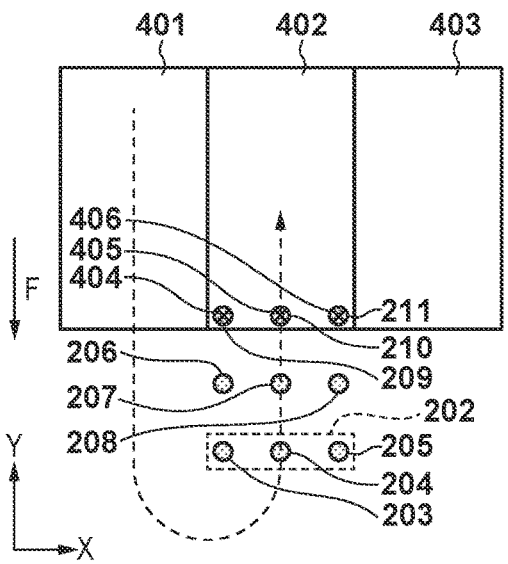
Figure 4C:
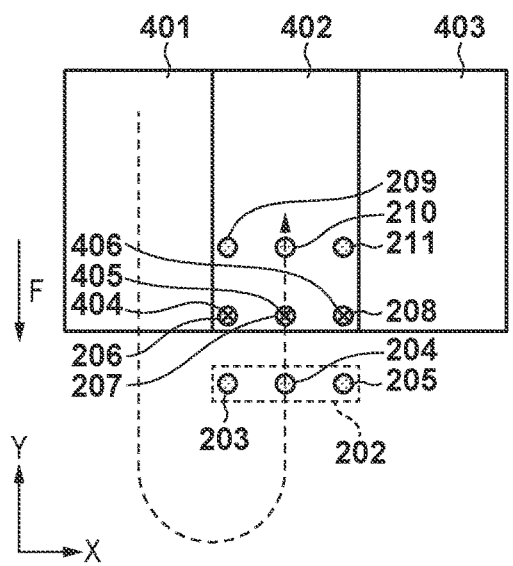

Measurement of the height-direction positions of measurement object portions in shot regions in an exposure process of exposing the substrate 104 will be described in detail with reference to FIGS. 4A to 4C. FIGS. 4A to 4C are views showing the exposure slit 202, the measurement points 203 to 211, shot regions 401, 402, and 403, measurement object portions 404, 405, and 406, and the trajectory of the substrate stage 105. There are a plurality of measurement object portions in the shot region 402 in the Y-axis direction in order to measure the height-direction position of the entire shot region 402. However, FIGS. 4A to 4C show only the measurement object portions 404, 405, and 406 for simplicity. In FIGS. 4A to 4C, the shot region 401 is a shot region having undergone the exposure process. The shot region 402 is a shot region to undergo the exposure process next to the shot region 401. The shot region 403 is a shot region to undergo the exposure process next to the shot region 402. In FIGS. 4A to 4C, an arrow indicated by a broken line represents the trajectory of the substrate stage 105 on the X-Y plane.

As shown in FIG. 4A, after the end of the exposure process for the shot region 401, the substrate stage 105 moves in the X-axis direction while decelerating in the Y-axis direction, and moves to the shot region 402 to undergo the exposure process next. When the substrate stage 105 reaches the acceleration start point in the Y-axis direction (that is, movement in the X-axis direction ends), it is accelerated and moved in the direction indicated by the arrow F.

As shown in FIG. 4B, when the measurement points 209 to 211 reach the measurement object portions 404 to 406 in the shot region 402, the height-direction positions of the measurement object portions 404 to 406 are measured at the measurement points 209 to 211. Based on measurement results at the measurement points 209 to 211 (the height-direction positions of the measurement object portions 404 to 406), the main control unit 127 obtains the driving amount (target value) of the substrate stage 105 in the Z-axis direction to position the exposure object area at the optimum exposure position. Based on the target value, the main control unit 127 starts the first driving in which the substrate 104 is driven in the Z-axis direction by the substrate stage 105 (the leveling stage). When the speed (scanning speed) of the substrate stage 105 becomes a target speed, the substrate stage 105 keeps moving at a constant speed until the exposure slit 202 passes through the shot region 402.

As shown in FIG. 4C, when the measurement points 206 to 208 reach the measurement object portions 404 to 406 in the shot region 402, the height-direction positions of the measurement object portions 404 to 406 are measured at the measurement points 206 to 208. Based on the measurement results at the measurement points 206 to 208 (height-direction positions of the measurement object portions 404 to 406), the main control unit 127 obtains the driving amount (target value) of the substrate stage 105 in the Z-axis direction to position the exposure object area at the optimum exposure position. Based on the target value, the main control unit 127 starts the second driving in which the substrate 104 is driven in the Z-axis direction by the substrate stage 105 (the leveling stage).

As described above, the main control unit 127 controls, by the first driving and the second driving in the exposure process, the substrate stage 105 so that a position of the substrate 104 in the Z-axis direction comes to the optimum exposure position until the shot region 402 of the substrate 104 reaches the exposure slit 202. Note that as described above, the first driving represents driving the substrate 104 in the Z-axis direction by the substrate stage 105 based on the measurement results at the measurement points 209 to 211 (second measurement unit). As described above, the second driving represents driving the substrate 104 in the Z-axis direction by the substrate stage 105 based on the measurement results at the measurement points 206 to 208 (first measurement unit).

Figure 5:
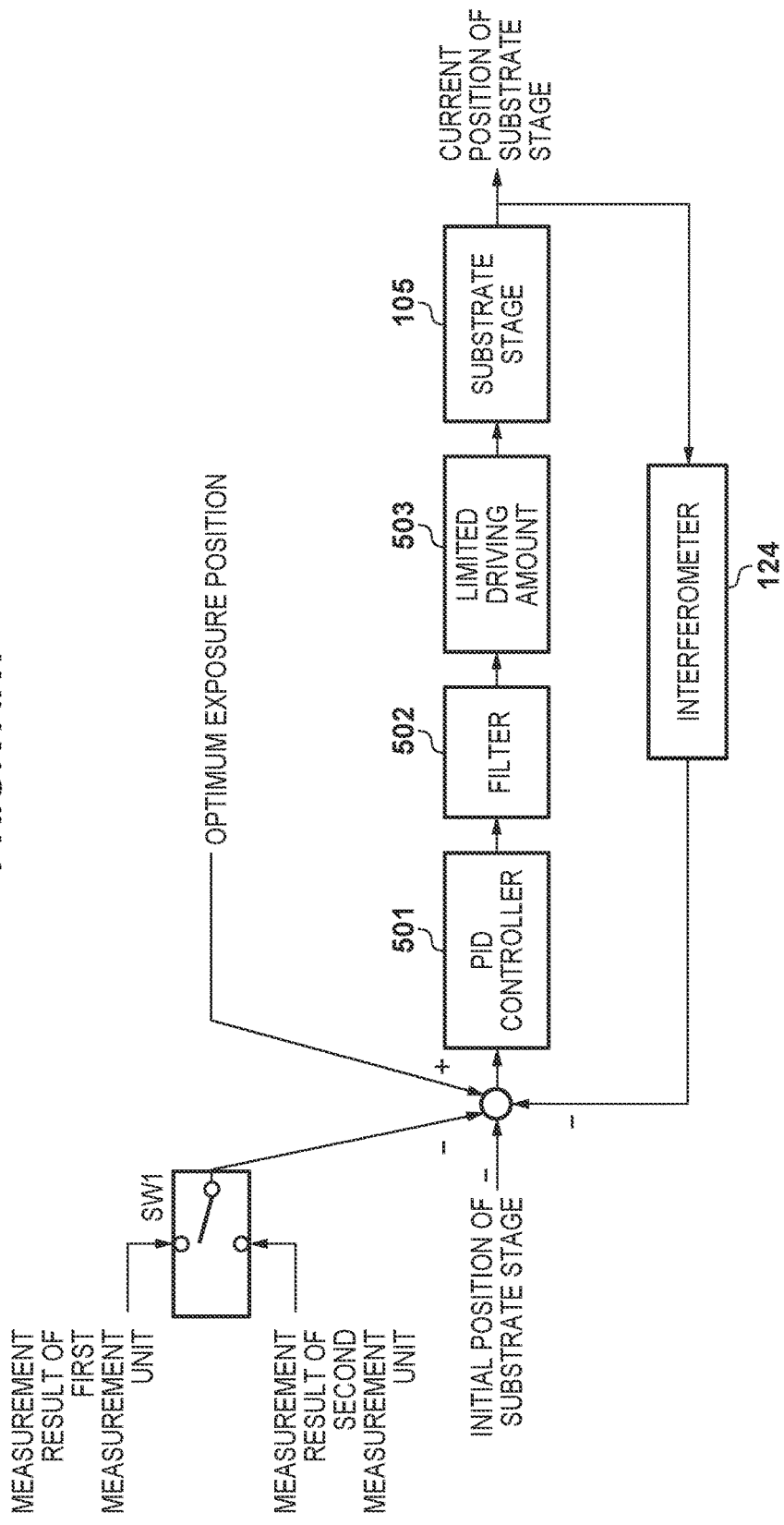
FIG. 5 is a block diagram for explaining control regarding driving of a substrate stage in the prior art.

Control regarding driving of the substrate stage 105 to position the position of the substrate 104 in the Z-axis direction at the optimum exposure position in the prior art will now be described with reference to FIG. 5, and FIGS. 6A and 6B. FIG. 5 is a schematic block diagram showing a control system regarding driving of the substrate stage 105. An example to which PID (Proportional-Integral-Differential) control is applied will be described here. The control system includes a PID controller 501, a filter 502, and a limited driving amount 503 of the substrate stage 105.

In FIG. 5, the initial position of the substrate stage 105 is the position of the substrate stage 105 in the Z-axis direction before the first driving or second driving of the substrate stage 105 to position the position of the substrate 104 in the Z-axis direction at the optimum exposure position is started. The switch SW1 is a switch which switches the measurement points of the measurement unit MU used to measure the height-direction positions of the measurement object portions in the shot region of the substrate 104. For example, in the first driving shown in FIG. 4B, the switch SW1 is switched such that the substrate stage 105 is driven (controlled) based on the measurement results at the measurement points 209 to 211 as the second measurement unit. In the second driving shown in FIG. 4C, the switch SW1 is switched such that the substrate stage 105 is driven (controlled) based on the measurement results at the measurement points 206 to 208 as the first measurement unit. The PID controller 501 is a controller configured to control driving of the substrate stage 105 in the Z-axis direction, and includes a P gain (proportional gain), a D gain (derivative gain), and an I gain (integral gain). If the driving amount of the substrate stage 105 input from the filter 502 is equal to or smaller than the limited driving amount 503, the driving amount is output without any change. On the other hand, if the driving amount of the substrate stage 105 input from the filter 502 is larger than the limited driving amount 503, the limited driving amount 503 is output as the driving amount of the substrate stage 105.

In the prior art, the shift amount of the substrate stage 105 (substrate 104) from the optimum exposure position is obtained based on the optimum exposure position, the initial position of the substrate stage 105, and the measurement result of the measurement unit MU. The target value regarding driving of the substrate stage 105 is obtained by applying, to the shift amount thus obtained, the respective gains of the PID controller 501, the filter 502 (for example, a cutoff frequency of low-pass filter processing), and the limited driving amount 503 of the substrate stage 105. The substrate stage 105 is driven so that the position of the substrate 104 in the Z-axis direction is positioned at the optimum exposure position while feeding back the position (current position) of the substrate stage 105 obtained from the interferometer 124 to the target value regarding driving of the substrate stage 105.

Then, in the prior art, the height-direction positions of measurement object portions (not shown) in the shot region 402 are measured sequentially. Once the exposure slit 202 reaches the shot region 402, the mask 102 is illuminated with light from the light source via the illumination optical system 106, and the shot region 402 is exposed while performing measurement by the measurement unit MU and driving of the substrate stage 105 in the Z-axis direction sequentially. Once the exposure slit 202 passes through the shot region 402, a process for exposing the shot region 403 is started, the substrate stage 105 is driven in the X-axis direction while decelerating it in the Y-axis direction, and then accelerates the substrate stage 105 in the Y-axis direction.

Figure 6A:
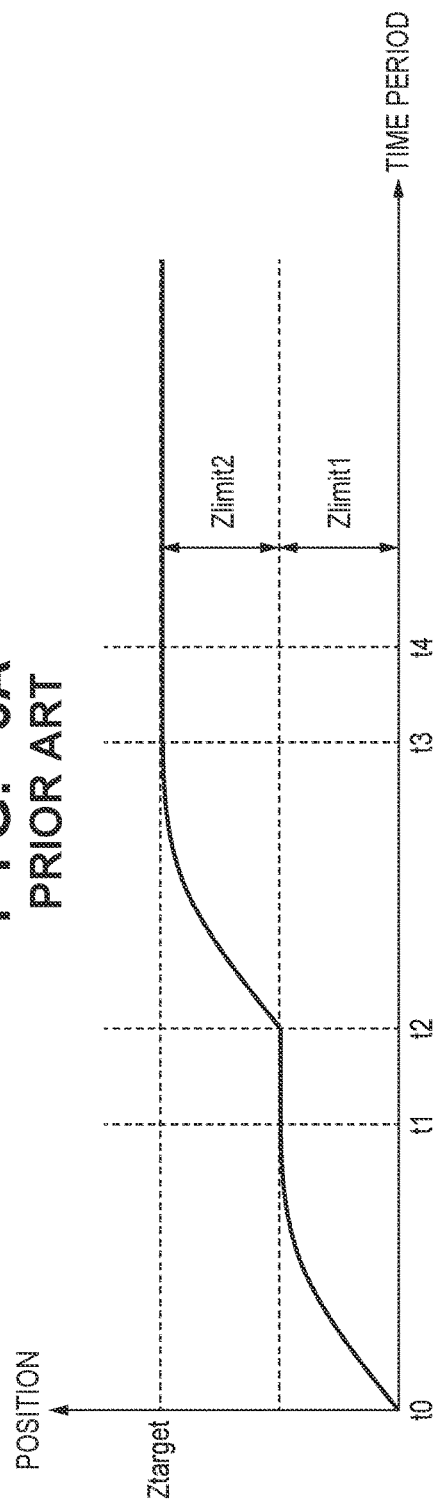
FIGS. 6A and 6B are timing charts for explaining control regarding driving of the substrate stage in the prior art.

FIG. 6A is a timing chart showing the relationship between a time period and the position of the substrate stage 105 in the Z-axis direction when the substrate stage 105 moves along the trajectory shown in FIGS. 4A to 4C in the prior art. In FIG. 6A, the ordinate represents the position of the substrate stage 105 in the Z-axis direction, and the abscissa represents the time period (time).

In FIG. 6A, time t0 is time at which the first driving is started, and time t1 is time at which the first driving is ended. Time t2 is time at which the second driving is started, and time t3 is time at which the second driving is ended. Time t4 is time at which the exposure slit 202 reaches the shot region 402. Ztarget is an optimum exposure position. Zlimit 1 is a limited driving amount of the substrate stage 105 in the first driving, that is, a driving amount of the substrate stage 105 in the Z-axis direction allowed in the first driving. In the first driving, the driving amount of the substrate stage 105 in the Z-axis direction is limited so that the driving amount of the substrate stage 105 falls within Zlimit 1. Zlimit 2 is a limited driving amount of the substrate stage 105 in the second driving, that is, a driving amount of the substrate stage 105 in the Z-axis direction allowed in the second driving. In the second driving, the driving amount of the substrate stage 105 in the Z-axis direction is limited so that the driving amount of the substrate stage 105 falls within Zlimit 2.

Note that a time period dt01 (from the time t0 to the time t1) required for the first driving and a time period dt23 (from the time t2 to the time t3) required for the second driving have a relationship of dt01=dt23. The limited driving amount Zlimit 1 in the first driving and the limited driving amount Zlimit 2 in the second driving have a relationship of Zlimit 1=Zlimit 2.

Figure 6B:
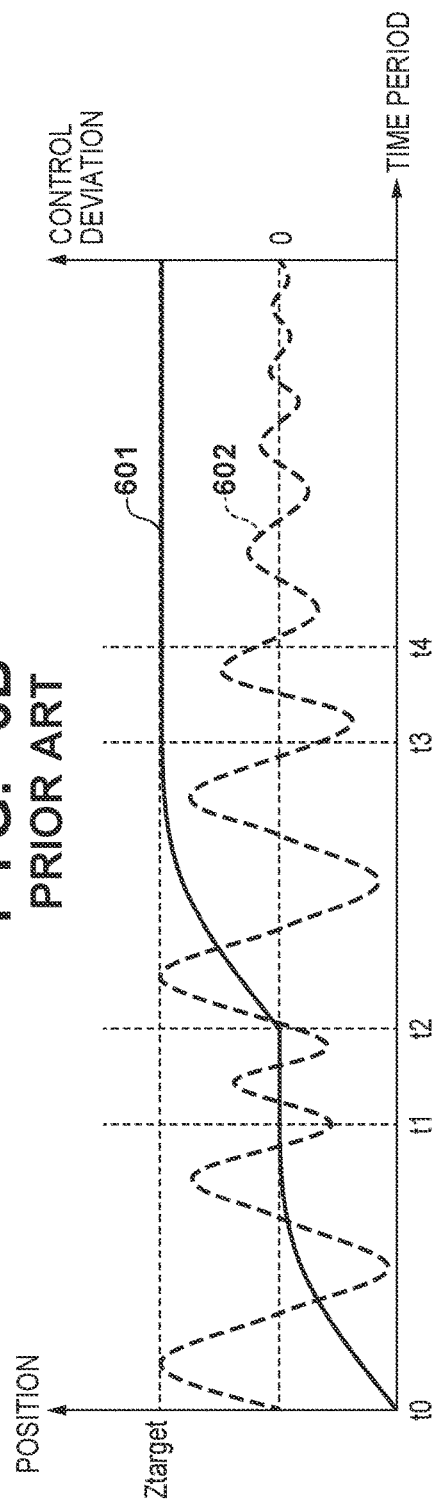

FIG. 6B is a timing chart in which the control deviation of the substrate stage 105 is added to the relationship between the time period and the position of the substrate stage 105 in the Z-axis direction shown in FIG. 6A. FIG. 6B shows a difference between the actual position of the substrate stage 105 and a target position 601 of the substrate stage 105 in the Z-axis direction at the respective times, that is, a control deviation 602 in the Z-axis direction. If the target position 601 of the substrate stage 105 in the Z-axis direction and the actual position of the substrate stage 105 in the Z-axis direction match, the control deviation 602 of the substrate stage 105 becomes 0.

Referring to FIG. 6B, immediately after the time t0 at which the first driving is started, the change amount of the target position 601 is large, and the change amount of the control deviation 602 is also large. As the time t1 at which the first driving is ended approaches, the change amount of the target position 601 decreases, and the change amount of the control deviation 602 also decreases. After the time t2 at which the second driving is started, however, the change amount of the target position 601 and the control deviation 602 increase again. As the time t3 at which the second driving is ended approaches, the change amount of the target position 601 decreases, the change amount of the control deviation 602 also decreases, and the control deviation 602 converges to 0. However, if the substrate stage 105 is driven by a driving amount that exceeds the response of the substrate stage 105 (driving amount that exceeds the limited driving amount), the control deviation of the substrate stage 105 increases. For example, at the time t4 when the exposure slit 202 reaches the shot region 402, the control deviation 602 remains greatly without converging to 0. This means a state in which the position of the substrate stage 105 in the Z-axis direction is shifted from the optimum exposure position. Therefore, if exposure of the shot region 402 is started at the time t4 with this control deviation 602 remaining greatly, that causes a resolution error by defocus.

To prevent this, in the embodiment, the main control unit 127 changes a control parameter in the first driving and a control parameter in the second driving, and controls driving of the substrate stage 105 in the Z-axis direction. More specifically, the main control unit 127 makes the driving amount of the substrate stage 105 in the Z-axis direction in the first driving larger than half a distance corresponding to the difference between the optimum exposure position and the positions of the measurement object portions in the Z-axis direction measured at the measurement points 209 to 211 of the second measurement unit, as will be described later.

Control regarding driving of the substrate stage 105 to position the position of the substrate 104 in the Z-axis direction at the optimum exposure position in the embodiment will be described with reference to FIGS. 7A and 7B, and FIG. 8. FIG. 7A is a timing chart showing the relationship between a time period and the position of the substrate stage 105 in the Z-axis direction when the substrate stage 105 moves along the trajectory shown in FIGS. 4A to 4C in the embodiment. In FIG. 7A, the ordinate represents the position of the substrate stage 105 in the Z-axis direction, and the abscissa represents the time period.

In FIG. 7A, the time t0 is the time at which the first driving is started, and time t1' is time at which the first driving is ended. The time t2 is the time at which the second driving is started, and time t3' is time at which the second driving is ended. The time t4 is the time at which the exposure slit 202 reaches the shot region 402. That is, exposure to a shot region to be exposed is started from the time t4, and it is thus preferable that the control deviation of the substrate stage 105 converges to an allowable value or smaller by the time t4. Ztarget is the optimum exposure position. Zlimit 1' is a limited driving amount of the substrate stage 105 in the first driving, that is, a driving amount of the substrate stage 105 in the Z-axis direction allowed in the first driving. In the first driving, the main control unit 127 limits the driving amount of the substrate stage 105 in the Z-axis direction so that the driving amount of the substrate stage 105 falls within Zlimit 1'. Zlimit 2' is a limited driving amount of the substrate stage 105 in the second driving, that is, a driving amount of the substrate stage 105 in the Z-axis direction allowed in the second driving. In the second driving, the main control unit 127 limits the driving amount of the substrate stage 105 in the Z-axis direction so that the driving amount of the substrate stage 105 falls within Zlimit 2'.

Note that Ztarget shown in FIG. 7A has the same amount as Ztarget shown in FIG. 6A. A time period from the time t0 to the time t4 shown in FIG. 7A is equal to a time period from the time t0 to the time t4 shown in FIG. 6A. Thus, FIG. 7A and FIG. 6A are the same in time period from the start of control driving of the substrate stage 105 to position the position of the substrate 104 in the Z-axis direction at the optimum exposure position to the start of exposure and driving amount of the substrate stage 105 in the Z-axis direction.

In FIG. 7A, a time period dt01' (from the time t0 to the time t1') required for the first driving and a time period dt23' (from the time t2 to the time t3') required for the second driving have a relationship of dt01'<dt23'. The limited driving amount Zlimit 1' in the first driving and the limited driving amount Zlimit 2' in the second driving have a relationship of Zlimit 1'>Zlimit 2'. As described above, the main control unit 127 makes the time period required for the first driving shorter than the time period required for the second driving and makes the limited driving amount Zlimit 1' in the first driving larger than the limited driving amount Zlimit 2' in the second driving.

FIG. 7B is a timing chart in which the control deviation of the substrate stage 105 is added to the relationship between the time period and the position of the substrate stage 105 in the Z-axis direction shown in FIG. 7A. FIG. 7B shows a control deviation 702 from a target position 701 of the substrate stage 105 in the Z-axis direction. If the target position 701 of the substrate stage 105 in the Z-axis direction and the actual position of the substrate stage 105 in the Z-axis direction match, the control deviation 702 of the substrate stage 105 becomes 0.

Referring to FIG. 7B, immediately after the time t0 at which the first driving is started, the change amount of the target position 701 is large, and the change amount of the control deviation 702 is also large. As the time t1' at which the first driving is ended approaches, the change amount of the target position 701 decreases, but the change amount of the control deviation 702 remains large because the substrate stage 105 is driven greatly in a short time period. Immediately after the time t2 at which the second driving is started, the change amount of the target position 701 is small, and thus the control deviation 702 newly caused by the second driving also becomes small. Therefore, a control deviation caused by the first driving becomes predominant in the control deviation 702 from the time t1'. On the other hand, a time period from the time t1' to the time t4 is longer than a time period from the time t1 to the time t4 shown in FIGS. 6A and 6B. Consequently, the control deviation 702 continues to converge to 0 and converges to 0 at the time t4. This means a state in which the position of the substrate stage 105 in the Z-axis direction matches the optimum exposure position. Therefore, the resolution error by defocus is not generated even if exposure of the shot region 402 is started at the time t4.

A control parameter may be set so as to satisfy the time period dt01' (from the time t0 to the time t1') required for the first driving>the time period dt23' (from the time t2 to the time t3') required for the second driving. This makes it possible to secure a long settling time period between the end of the second driving and the start of exposure, and thus to reduce the control deviation at time when exposure is started.

Figure 8:
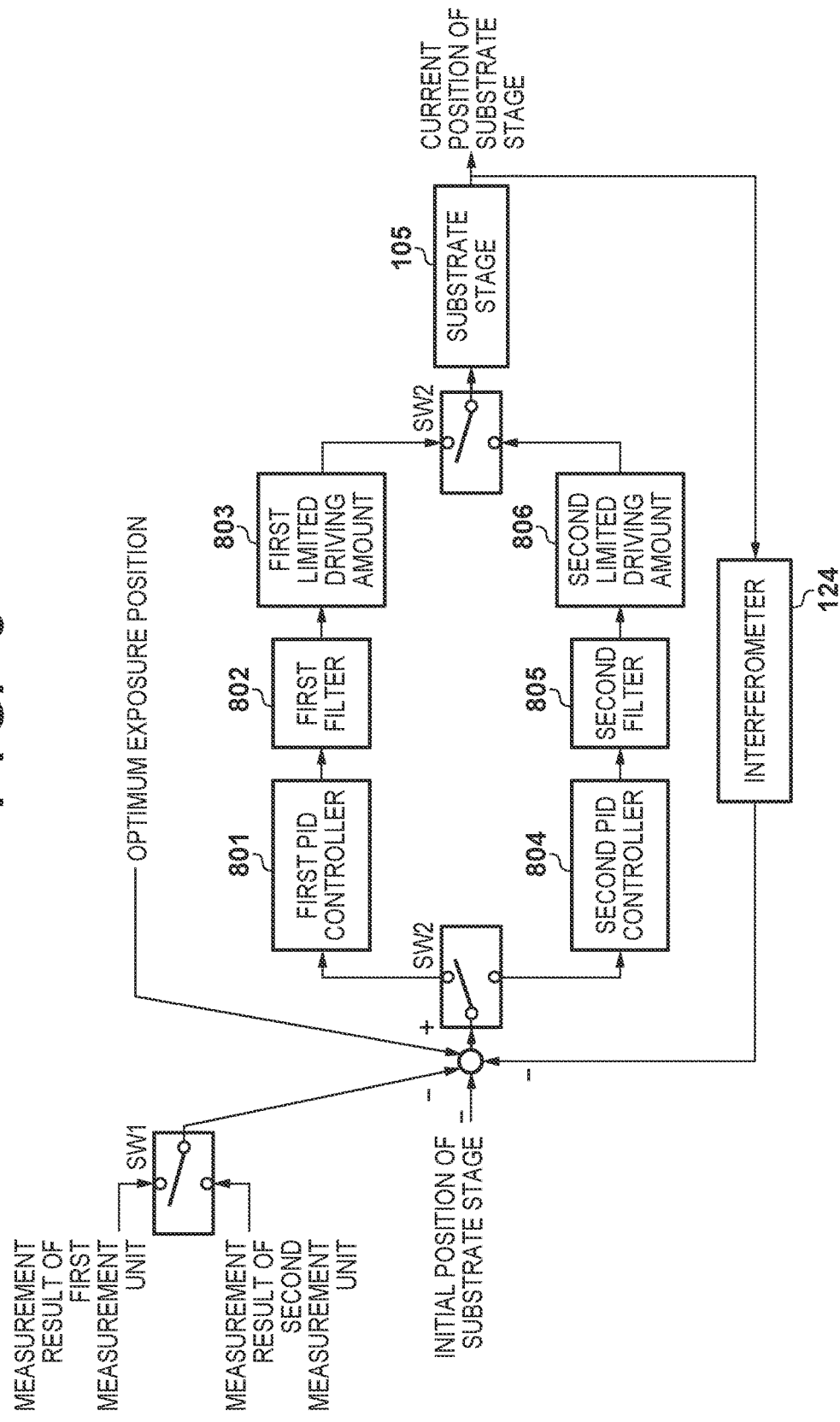
FIG. 8 is a block diagram for explaining control regarding driving of the substrate stage according to the embodiment.

FIG. 8 is a schematic block diagram showing a control system regarding driving of the substrate stage 105 in the embodiment (main control unit 127). An example to which PID control is applied will be described, as in the prior art. The control system includes a first PID controller 801, a first filter 802, a first limited driving amount 803 of the substrate stage 105, a second PID controller 804, a second filter 805, and a second limited driving amount 806 of the substrate stage 105.

In FIG. 8, the initial position of the substrate stage 105 is the position of the substrate stage 105 in the Z-axis direction before the first driving or second driving of the substrate stage 105 to position the position of the substrate 104 in the Z-axis direction at the optimum exposure position is started. The switch SW1 is the switch which switches the measurement points of the measurement unit MU used to measure the height-direction positions of the measurement object portions in the shot region of the substrate 104. For example, in the first driving shown in FIG. 4B, the switch SW1 is switched such that the substrate stage 105 is driven (controlled) based on the measurement results at the measurement points 209 to 211 as the second measurement unit. In the second driving shown in FIG. 4C, the switch SW1 is switched such that the substrate stage 105 is driven (controlled) based on the measurement results at the measurement points 206 to 208 as the first measurement unit. The first PID controller 801 is a controller configured to control driving of the substrate stage 105 in the Z-axis direction in the first driving, and includes the first P gain (proportional gain), the first D gain (derivative gain), and the first I gain (integral gain). The first filter 802 is a filter (for example, a cutoff frequency of low-pass filter processing) in the first driving. The first limited driving amount 803 is the limited driving amount (in the embodiment, Zlimit 1') of the substrate stage 105 in the first driving. The second PID controller 804 is a controller configured to control driving of the substrate stage 105 in the Z-axis direction in the second driving, and includes the second P gain different from the first P gain, the second D gain different from the first D gain, and the second I gain different from the first I gain. The second filter 805 is a filter (for example, a cutoff frequency of low-pass filter processing) in the second driving. The second limited driving amount 806 is the limited driving amount (in the embodiment, Zlimit 2') of the substrate stage 105 in the second driving. A switch SW2 is a switch which switches the PID controllers, the filters, and the limited driving amounts used between the first driving and the second driving. For example, in the first driving shown in FIG. 4B, the switch SW2 is switched such that the first PID controller 801, the first filter 802, and the first limited driving amount 803 are used. In the second driving shown in FIG. 4C, the switch SW2 is switched such that the second PID controller 804, the second filter 805, and the second limited driving amount 806 are used.

In the first driving, if the driving amount of the substrate stage 105 input from the first filter 802 is equal to or smaller than the first limited driving amount 803, the driving amount is output without any change. On the other hand, in the first driving, if the driving amount of the substrate stage 105 input from the first filter 802 is larger than the first limited driving amount 803, the first limited driving amount 803 is output as the driving amount of the substrate stage 105. Similarly, in the second driving, if the driving amount of the substrate stage 105 input from the second filter 805 is equal to or smaller than the second limited driving amount 806, the driving amount is output without any change. On the other hand, in the second driving, if the driving amount of the substrate stage 105 input from the second filter 805 is larger than the second limited driving amount 806, the second limited driving amount 806 is output as the driving amount of the substrate stage 105.

Based on the optimum exposure position, the initial position of the substrate stage 105, and the measurement result of the measurement unit MU, the main control unit 127 obtains the shift amount of the substrate stage 105 (substrate 104) from the optimum exposure position. In the first driving, the target value regarding driving of the substrate stage 105 is obtained by applying, to the shift amount thus obtained, the respective gains of the first PID controller 801, the first filter 802, and the first limited driving amount 803. In the second driving, the target value regarding driving of the substrate stage 105 is obtained by applying the respective gains of the second PID controller 804, the second filter 805, and the second limited driving amount 806 to the shift amount thus obtained. The position of the substrate 104 in the Z-axis direction is positioned at the optimum exposure position by the first driving and the second driving while feeding back the position (current position) of the substrate stage 105 obtained from the interferometer 124 to the target value regarding driving of the substrate stage 105.

According to the embodiment, it is possible to suppress the control deviation of the substrate stage 105 at an exposure start even if the substrate stage 105 has to be driven in a short time period and by a large driving amount in order to position the position of the substrate 104 in the Z-axis direction at the optimum exposure position. Therefore, the exposure apparatus 100 can reduce the resolution error by defocus.

Control parameters changed between the first driving and the second driving may be gains. The response of the substrate stage 105 in the first driving is increased by making the D gain of the first PID controller 801 in the first driving higher than the D gain of the second PID controller 804 in the second driving. A steady state deviation in the second driving is suppressed by making the I gain of the first PID controller 801 in the first driving smaller than the integral gain of the second PID controller 804 in the second driving. It is possible, by changing the gains in the first driving and the second driving as described above, to make the driving amount of the substrate stage 105 in the Z-axis direction in the first driving larger than that in the second driving. This makes it possible to suppress the control deviation of the substrate stage 105 at the exposure start and to reduce the resolution error by defocus.

Control parameters changed between the first driving and the second driving may be cutoff frequencies (filter constants) in low-pass filter processing. A case in which, for example, control data for controlling driving of the substrate stage 105 in the Z-axis direction is generated by using each of the first filter 802 and the second filter 805 will be examined. In this case, low-pass filter processing having a cutoff frequency is performed on each of the first difference data between the optimum exposure position and the measurement result of the second measurement unit, and the second difference data between the optimum exposure position and the measurement result of the first measurement unit. At this time, the cutoff frequency of the low-pass filter processing performed on the first difference data is made higher than that on the second difference data. More specifically, the response of the substrate stage 105 in the first driving is increased by setting the cutoff frequency of the first filter 802 used in the first driving high. An increase in control deviation in the second driving is suppressed by setting the cutoff frequency of the second filter 805 used in the second driving low. It is possible, by changing the cutoff frequencies of the low-pass filter processing in the first driving and the second driving as described above, to make the driving amount of the substrate stage 105 in the Z-axis direction in the first driving larger than that in the second driving. This makes it possible suppress the control deviation of the substrate stage 105 at the exposure start and to reduce the resolution error by defocus.

Figure 9:
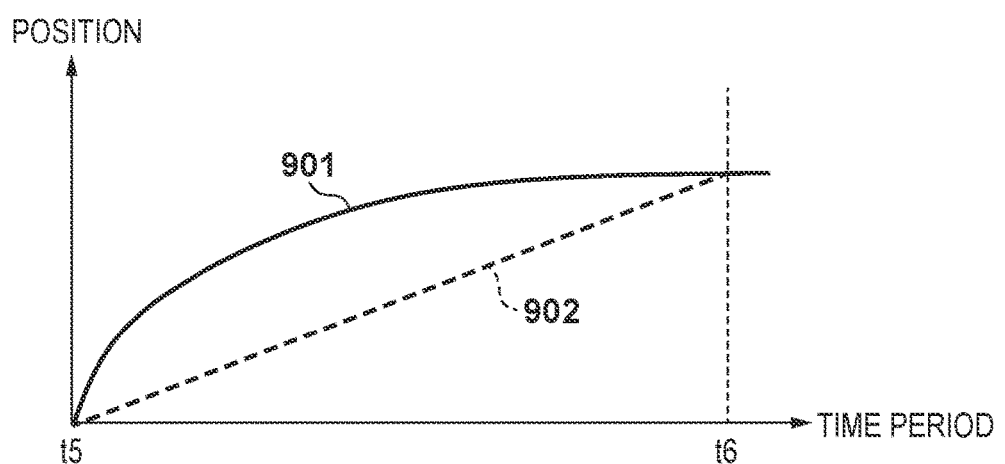
FIG. 9 is a timing chart for explaining control regarding driving of the substrate stage according to the embodiment.

Control parameters changed between the first driving and the second driving may be the type of functions used for interpolation when the trajectory of the substrate stage 105 with respect to its position in the Z-axis direction is obtained. FIG. 9 is a timing chart showing the trajectory of the substrate stage 105 with respect to its position in the Z-axis direction. In FIG. 9, the ordinate represents the position of the substrate stage 105 in the Z-axis direction, and the abscissa represents a time period. Time t5 is time at which driving of the substrate stage 105 in the Z-axis direction is started. Time t6 is time at which driving of the substrate stage 105 in the Z-axis direction is ended. For example, when the target value of driving of the substrate stage 105 to position the position of the substrate 104 in the Z-axis direction at the optimum exposure position is obtained, in the first driving, interpolation is performed such that the change amount of that driving amount becomes a steep trajectory 901, increasing the response of the substrate stage 105 in the first driving. In the first driving, for example, interpolation is performed on a time period from the time t5 with a linear function. In the second driving, interpolation is performed so that the change amount of the driving amount of the substrate stage 105 becomes a moderate trajectory 902, suppressing the increase in control deviation of the substrate stage 105 in the second driving. In the second driving, for example, interpolation is performed on a time period from the time t6 with a saturation function (such as a root function). In other words, the maximum value of the change amount of the driving amount of the substrate stage 105 with respect to the time period in the first driving is made larger than that in the second driving. As described above, the type of functions used for interpolation when the trajectory of the substrate stage 105 is obtained in the first driving and the second driving is changed. This makes it possible to make the driving amount of the substrate stage 105 in the Z-axis direction in the first driving larger than that in the second driving. It is therefore possible to suppress the control deviation of the substrate stage 105 at the exposure start and to reduce the resolution error by defocus.

The response of the substrate stage 105 to the Z-axis direction may be different at the rotation about the X-axis, the rotation about the Y-axis, and the position in the Z-axis direction. In this case, control parameters changed between the first driving and the second driving may be changed with respect to the rotation about the X-axis, the rotation about the Y-axis, and the position in the Z-axis direction.

Control parameters changed between the first driving and the second driving can combine the above-described parameters freely. Note that in the embodiment, the PID controller and the filter are provided for each of the first driving and the second driving, as shown in FIG. 8. However, the present invention is not limited to this. An arrangement may be possible in which, for example, control parameters are changed between the first driving and the second driving for one PID controller and one filter.

Figure 10:
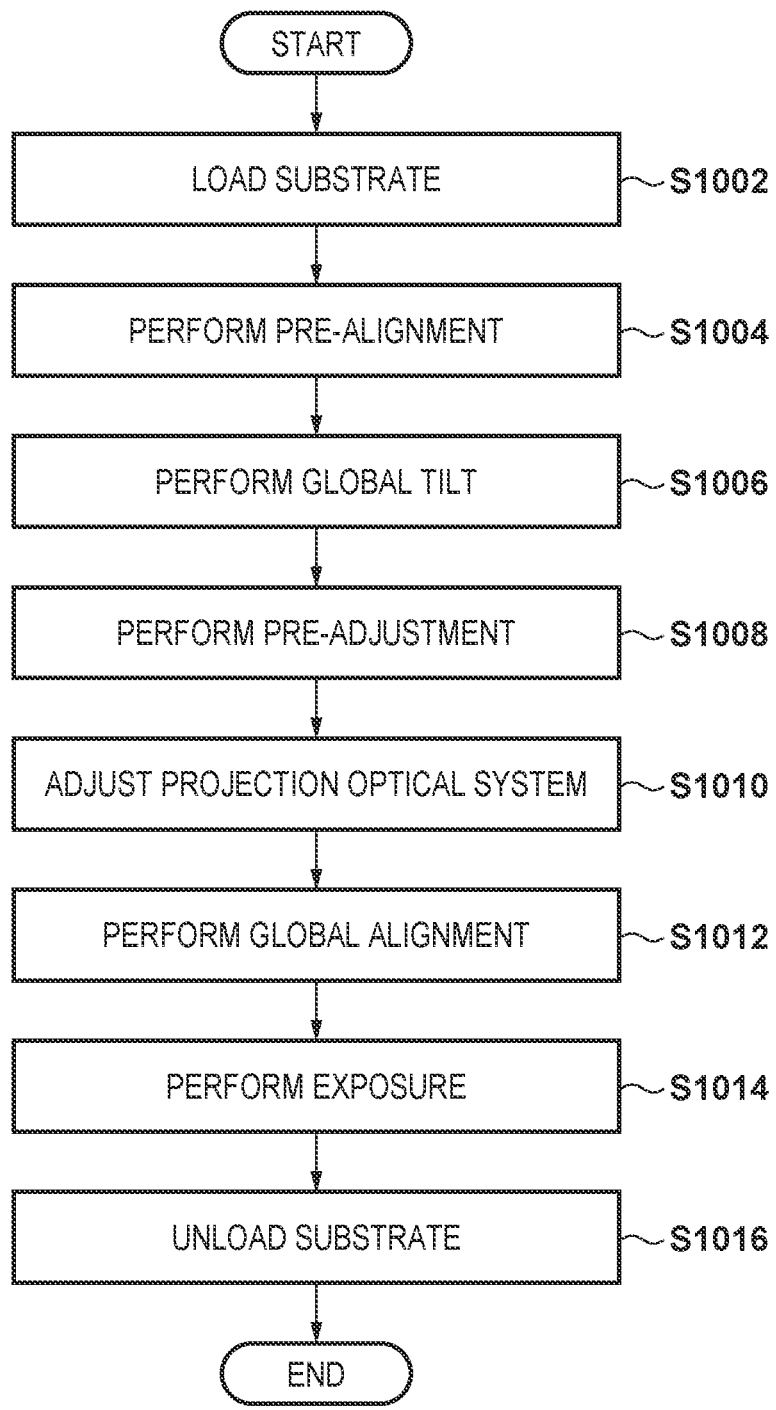
FIG. 10 is a flowchart for explaining the exposure process in the exposure apparatus shown in FIG. 1.

An operation in the exposure apparatus 100, that is, the exposure process will be described with reference to FIG. 10. As described above, the exposure process is performed by comprehensively controlling the respective units of the exposure apparatus 100 by the main control unit 127.

In step S1002, the substrate 104 is loaded into the exposure apparatus 100. More specifically, the substrate 104 is conveyed by a conveying hand (not shown) and held by the substrate stage 105.

In step S1004, pre-alignment (pre-measurement and correction) for global alignment is performed. More specifically, the shift amount such as the rotation error of the substrate 104 is measured and corrected using a low-magnification field alignment microscope (not shown) so that an alignment mark on the substrate 104 falls within the measurement range of a high-magnification field alignment microscope (not shown) to be used in global alignment.

Figure 11:
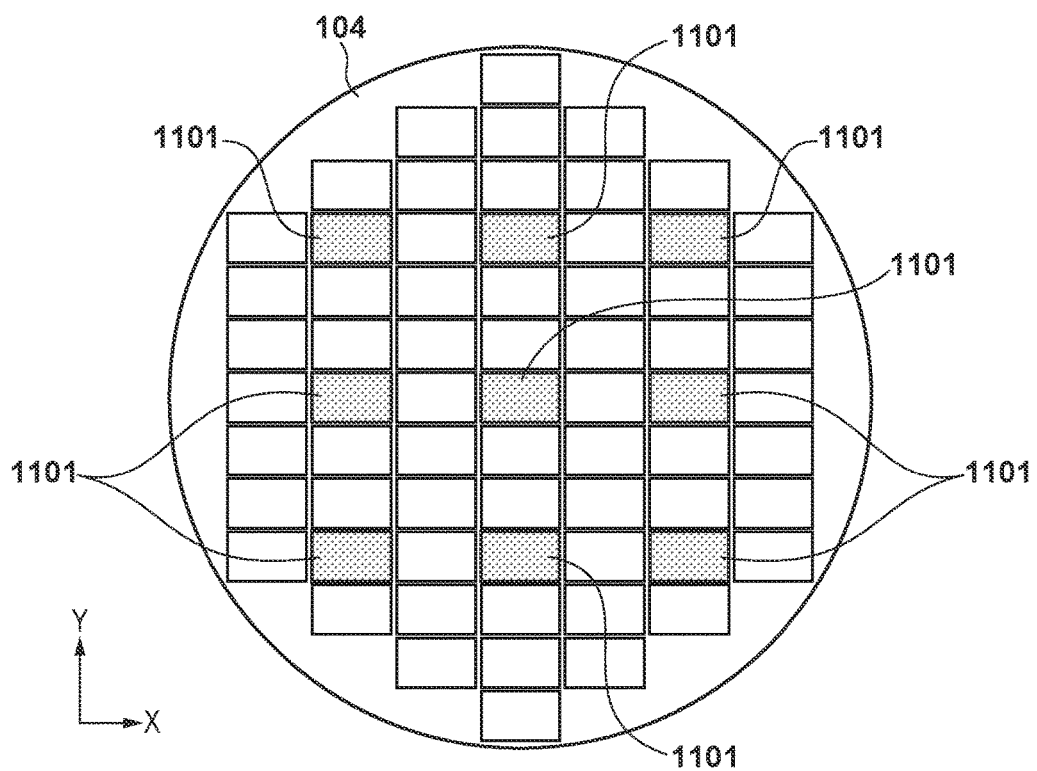
FIG. 11 is a view showing an example of the layout of a plurality of shot regions on the substrate.

In step S1006, global tilt is performed. More specifically, as shown in FIG. 11, the measurement unit MU measures the height-direction positions of sample shot regions 1101 among a plurality of shot regions of the substrate 104. The global tilt of the substrate 104 is calculated and corrected based on the height-direction positions of the sample shot regions 1101 measured by the measurement unit MU.

In step S1008, pre-adjustment is performed for measurement of the height-direction position of the substrate 104 during exposure (during scanning of the mask stage 103 and substrate stage 105). Pre-adjustment includes, for example, adjustment of the light amount of the light source 110 of each measurement unit MU, storage of a pattern step in the shot region of the substrate 104, and the like. Pre-adjustment is performed on the measurement unit MU including the measurement points 203 to 217.

In step S1010, the projection optical system 101 is adjusted. More specifically, the tilt of the projection optical system 101, the curvature of field, and the like are obtained using a light amount sensor and reference mark (neither is shown) arranged on the substrate stage 105, and a reference plate (not shown) arranged on the mask stage 103. For example, the light amount sensor arranged on the substrate stage 105 measures a change of the amount of exposure light when the substrate stage 105 is scanned in the X-, Y-, and Z-axis directions. The shift amount of the reference mark with respect to the reference plate is obtained based on the change of the amount of exposure light, and the projection optical system 101 is adjusted.

In step S1012, global alignment is performed. More specifically, the alignment mark of the substrate 104 is measured using a high-magnification field alignment microscope, obtaining the shift amount of the overall substrate 104 and a shift amount common to respective shot regions. To measure the alignment mark at high accuracy, the alignment mark needs to be positioned at a position (best contrast position) at which the contrast of the alignment mark becomes best. Measurement of the best contrast position uses the measurement unit MU and an alignment microscope. For example, the substrate stage 105 is driven to a predetermined height (position in the Z-axis direction), the alignment microscope measures the contrast, and the measurement unit MU measures the height of the substrate 104 in the Z-axis direction. This process is repeated. At this time, a contrast measurement result corresponding to each position of the substrate stage 105 in the Z-axis direction and the measurement result of the position of the substrate 104 in the Z-axis direction are saved in association with each other. Then, a position of the substrate stage 105 in the Z-axis direction where the contrast becomes highest is obtained based on a plurality of contrast measurement results and is defined as a best contrast position.

In step S1014, the exposure object shot region of the substrate 104 is exposed. More specifically, the measurement unit MU measures the height-direction positions of measurement object portions in the exposure object shot region, and exposes the exposure object shot region while positioning the position of the substrate 104 in the Z-axis direction at the optimum exposure position by the substrate stage 105. Driving of the substrate stage 105 to position the position of the substrate 104 in the Z-axis direction at the optimum exposure position is performed by the first driving and the second driving, as described above. At this time, the driving amount of the substrate stage 105 in the Z-axis direction in the first driving is made larger than half the distance corresponding to the difference between the optimum exposure position and the positions of the measurement object portions in the Z-axis direction measured at the measurement points 209 to 211 of the second measurement unit.

In step S1016, the substrate 104 is unloaded from the exposure apparatus 100. More specifically, the exposed substrate 104 is received from the substrate stage 105 by the conveying hand (not shown), and conveyed outside the exposure apparatus 100.

A method of manufacturing an article according to the embodiment of the present invention is suitable for manufacturing an article, for example, a device (a semiconductor device, a magnetic storage medium, a liquid crystal display element, or the like). The manufacturing method includes, using the exposure apparatus 100, a step of exposing a substrate coated with a photosensitive agent and a step of developing the exposed substrate. The manufacturing method can also include other known steps (oxidation, deposition, vapor deposition, doping, planarization, etching, resist removal, dicing, bonding, packaging, and the like). The method of manufacturing the article according to the embodiment is superior to a conventional method in at least one of the performance, quality, productivity, and production cost of the article.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2016-180906 filed on Sep. 15, 2016 which is hereby incorporated by reference herein in its entirety.

What is claimed is:

1. An exposure apparatus for transferring a pattern of a mask onto a substrate by exposing the substrate while scanning the mask and the substrate, the apparatus comprising:
   a stage configured to hold and move the substrate;
   a control unit configured to control movement of the stage;
   a first measurement unit configured to measure a position, in a height direction, of a shot region of the substrate held by the stage before the shot region reaches an exposure area where the shot region is exposed; and
   a second measurement unit configured to measure the position of the shot region in the height direction prior to the first measurement unit,
   wherein the control unit:
      controls the stage to perform:
         first driving where the substrate is driven in the height direction based on a measurement result of the second measurement unit; and
         second driving where the substrate is driven in the height direction based on a measurement result of the first measurement unit after the second measurement unit measures the position of the shot region in the height direction and until the shot region reaches the exposure area;
      makes a second driving amount of the stage in the height direction in the second driving smaller than a first driving amount of the stage in the height direction in the first driving;
      controls the stage so that the position of the shot region in the height direction is positioned at a first target position different from a second target position of the shot region in the height direction by the first driving and is positioned at the second target position by the second driving; and
      makes a time period required for the first driving from the position of the shot region in the height direction measured by the second measurement unit to the first target position shorter than a time period required for the second driving from the position of the shot region in the height direction measured by the first measurement unit to the second target position.

2. The apparatus according to claim 1, wherein the control unit:
   includes a PID controller configured to control driving of the stage in the height direction,
   makes a derivative gain of the PID controller in the first driving higher than a derivative gain of the PID controller in the second driving.

3. The apparatus according to claim 2, wherein the controller makes an integral gain of the PID controller in the first driving smaller than an integral gain of the PID controller in the second driving.

4. The apparatus according to claim 1, wherein the control unit:
   performs low-pass filter processing having a cutoff frequency on each of first difference data between the second target position and the position of the shot region in the height direction measured by the second measurement unit, and second difference data between the second target position and the position of the shot region in the height direction measured by the first measurement unit to generate control data for controlling driving of the stage in the height direction; and
   makes the cutoff frequency of the low-pass filter processing performed on the first difference data higher than the cutoff frequency of the low-pass filter processing performed on the second difference data.

5. The apparatus according to claim 1, wherein the control unit makes a maximum value of a change amount of the first driving amount of the stage with respect to a time period in the first driving larger than a maximum value of a change amount of the second driving amount of the stage with respect to a time period in the second driving.

6. The apparatus according to claim 1, further comprising:
a projection optical system configured to project the pattern of the mask onto the substrate,
wherein a position of an image plane of the projection optical system comes to the second target position.

7. The apparatus according to claim 1, wherein the first measurement unit and the second measurement unit have the same measurement accuracy in measurement of the position of the shot region in the height direction.

8. The apparatus according to claim 1, wherein the first measurement unit and the second measurement unit have the same configuration for measuring the position of the shot region in the height direction.

9. A method of manufacturing an article, the method comprising the steps of:
forming a pattern on a substrate using an exposure apparatus; and
developing the exposed substrate to manufacture the article,
wherein the exposure apparatus transfers a pattern of a mask onto the substrate by exposing the substrate while scanning the mask and the substrate, and includes:
a stage configured to hold and move the substrate;
a control unit configured to control movement of the stage;
a first measurement unit configured to measure a position, in a height direction, of a shot region of the substrate held by the stage before the shot region reaches an exposure area where the shot region is exposed; and
a second measurement unit configured to measure the position of the shot region in the height direction prior to the first measurement unit,
wherein the control unit:
controls the stage to perform:
first driving where the substrate is driven in the height direction based on a measurement result of the second measurement unit; and
second driving where the substrate is driven in the height direction based on a measurement result of the first measurement unit after the second measurement unit measures the position of the shot region in the height direction and until the shot region reaches the exposure area;
makes a second driving amount of the stage in the height direction in the second driving smaller than a first driving amount of the stage in the height direction in the first driving;
controls the stage so that the position of the shot region in the height direction is positioned at a first target position different from a second target position of the shot region in the height direction by the first driving and is positioned at the second target position by the second driving; and
makes a time period required for the first driving from the position of the shot region in the height direction measured by the second measurement unit to the first target position shorter than a time period required for the second driving from the position of the shot region in the height direction measured by the first measurement unit to the second target position.

10. An exposure apparatus for transferring a pattern of a mask onto a substrate by exposing the substrate, the apparatus comprising:
a stage configured to hold and move the substrate;
a control unit configured to control movement of the stage;
a first measurement unit configured to measure a position, in a height direction, of a shot region of the substrate held by the stage before the shot region reaches an exposure area where the shot region is exposed; and
a second measurement unit configured to measure the position of the shot region in the height direction prior to the first measurement unit,
wherein the control unit:
controls the stage to perform:
first driving where the substrate is driven in the height direction based on a measurement result of the second measurement unit; and
second driving where the substrate is driven in the height direction based on a measurement result of the first measurement unit after the second measurement unit measures the position of the shot region in the height direction and until the shot region reaches the exposure area;
makes a second driving amount of the stage in the height direction in the second driving smaller than a first driving amount of the stage in the height direction in the first driving;
controls the stage so that the position of the shot region in the height direction is positioned at a first target position different from a second target position of the shot region in the height direction by the first driving and is positioned at the second target position by the second driving; and
makes a time period required for the first driving from the position of the shot region in the height direction measured by the second measurement unit to the first target position shorter than a time period required for the second driving from the position of the shot region in the height direction measured by the first measurement unit to the second target position.

11. A method of manufacturing an article, the method comprising the steps of:
forming a pattern on a substrate using an exposure apparatus; and
developing the exposed substrate to manufacture the article,
wherein the exposure apparatus transfers a pattern of a mask onto the substrate by exposing the substrate, and includes:
a stage configured to hold and move the substrate;
a control unit configured to control movement of the stage;
a first measurement unit configured to measure a position, in a height direction, of a shot region of the substrate held by the stage before the shot region reaches an exposure area where the shot region is exposed; and
a second measurement unit configured to measure the position of the shot region in the height direction prior to the first measurement unit,
wherein the control unit:
controls the stage to perform:
first driving where the substrate is driven in the height direction based on a measurement result of the second measurement unit; and second driving where the substrate is driven in the height direction based on a measurement result of the first measurement unit after the second measurement unit measures the position of the shot region in the height direction and until the shot region reaches the exposure area;

makes a second driving amount of the stage in the height direction in the second driving smaller than a first driving amount of the stage in the height direction in the first driving;

controls the stage so that the position of the shot region in the height direction is positioned at a first target position different from a second target position of the shot region in the height direction by the first driving and is positioned at the second target position by the second driving; and makes a time period required for the first driving from the position of the shot region in the height direction measured by the second measurement unit to the first target position shorter than a time period required for the second driving from the position of the shot region in the height direction measured by the first measurement unit to the second target position.

* * * * *